(12) United States Patent
Kuramachi

(10) Patent No.: US 6,621,159 B1
(45) Date of Patent: Sep. 16, 2003

(54) SEMICONDUCTOR LIGHT EMITTING DEVICE AND METHOD FOR MANUFACTURING THE SAME

(75) Inventor: Teruhiko Kuramachi, Kaisei-machi (JP)

(73) Assignee: Fuji Photo Film Co., Ltd., Kanagawa-Ken (JP)

( * ) Notice: Subject to any disclaimer, the term of this patent is extended or adjusted under 35 U.S.C. 154(b) by 0 days.

(21) Appl. No.: 09/531,215

(22) Filed: Mar. 20, 2000

(30) Foreign Application Priority Data

Mar. 19, 1999 (JP) ............................ 11-076039

(51) Int. Cl.[7] .................. H01L 23/36; H01L 23/34
(52) U.S. Cl. .................. 257/712; 257/625; 257/99
(58) Field of Search .................. 257/91, 99, 625, 257/678, 706, 707, 708, 712, 751, 720

(56) References Cited

U.S. PATENT DOCUMENTS

| | | | | |
|---|---|---|---|---|
| 4,321,617 A | * | 3/1982 | Duda et al. .................. | 357/71 |
| 5,225,711 A | * | 7/1993 | Chang et al. ............... | 257/750 |
| 5,596,231 A | * | 1/1997 | Combs ........................ | 257/776 |
| 5,734,200 A | * | 3/1998 | Hsue et al. .................. | 257/755 |
| 5,776,512 A | * | 7/1998 | Weber ........................ | 425/116 |
| 5,981,310 A | * | 11/1999 | DiGiacomo et al. ........ | 438/108 |
| 6,025,213 A | * | 2/2000 | Nemoto et al. ............. | 438/122 |
| 6,280,861 B1 | * | 8/2001 | Hosokawa et al. .......... | 428/690 |

FOREIGN PATENT DOCUMENTS

| | | | | |
|---|---|---|---|---|
| JP | 80010137 A | * | 3/1980 | ........... H01L/23/12 |
| JP | 56-28039 | | 6/1981 | ............. H01S/3/18 |
| JP | 403152960 A | * | 6/1991 | ........... H01L/23/36 |
| JP | 407263788 A | * | 10/1995 | ............. H01S/3/18 |

* cited by examiner

Primary Examiner—Nathan J. Flynn
Assistant Examiner—Johannes P Mondt
(74) Attorney, Agent, or Firm—Sughrue Mion, PLLC

(57) ABSTRACT

On a heat sink having a low thermal resistance, an Ni thin film layer is formed at a film thickness of 2 μm to 6 μm. On the face to which a semiconductor light emitting element is to be bonded and the face on the side from which light is to be emitted, a barrier metallic layer is formed at a film thickness of 50 nm to 150 nm in the region as wide as four times the area of the bonding face of the semiconductor light emitting element. A wettability improving metallic layer is formed at a film thickness of 50 nm to 150 nm. The semiconductor light emitting element stacks layers of AlGaAs, GaAs, GaAsP, and InGaAs, all on a GaAs substrate. An N electrode includes AuGe/Ni/Au , and a P electrode includes Au/Pt/Ti/Pt/Ti and is pressed and soldered against the bonding face of the heat sink.

9 Claims, 3 Drawing Sheets

F I G . 1
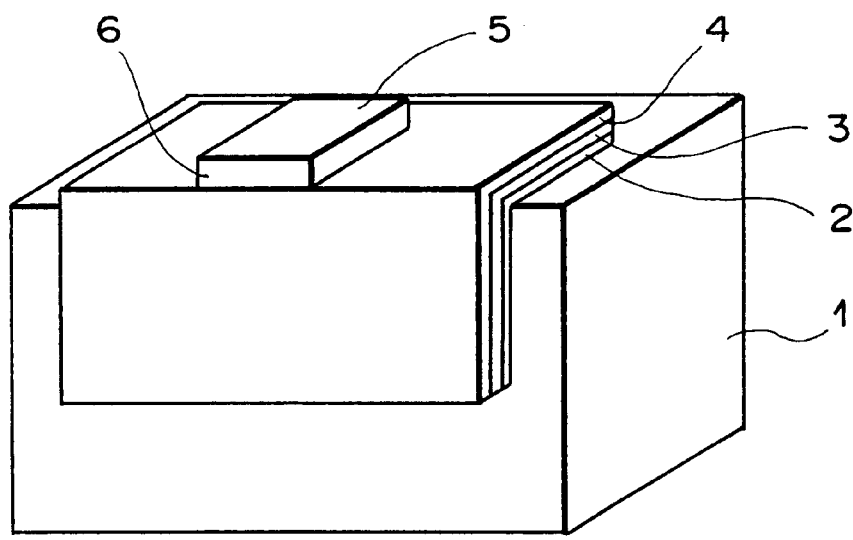

DEPENDENCY OF PREAGING DETERIORATION
RATE ON Ni FILM THICKNESS

DEPENDENCY OF PREAGING DETERIORATION RATE ON Pt FILM THICKNESS

SEMICONDUCTOR LIGHT EMITTING DEVICE AND METHOD FOR MANUFACTURING THE SAME

BACKGROUND OF THE INVENTION

1. Field of the Invention

The present invention relates to a semiconductor light emitting device, and particularly to a semiconductor light emitting device with which a semiconductor light emitting element is bonded to a heat sink on which metallic layers are stacked.

2. Description of the Prior Art

When a semiconductor light emitting element, such as a semiconductor laser, is to be bonded to a heat sink, it is particularly essential to reduce the thermal resistance in order to minimize the distortion, and to do this, a heat sink made of a material having a relatively low thermal resistance has been used, and it has been necessary to flatten the bonding surface so that the semiconductor light emitting element can be uniformly bonded to the heat sink.

Because the heat sink is made mainly of a coppery material, it has presented problems of that, when it is left in the atmosphere for a long period of time, it is oxidized, resulting in the electrical resistance and the thermal resistance being increased, and the oxide and other impurities tending to be diffused into the semiconductor light emitting element.

One of the solutions to these problems that have been adopted is to subject the face of the heat sink to a surface treatment, such as polishing and chemical etching, in order to form an unoxidized layer surface; to provide immediately thereafter, on the heat sink, a barrier metallic layer of Ni, Ti or other metal which will not directly react with copper, in order to suppress the diffusion, and to form, thereon, a thin film of Au, Pt or other metal having a good corrosion characteristic. In addition, it is required to form, on the top layer, such a layer as a Pt thin film layer, which has a good wettability with an In solder to bond the semiconductor light emitting element to the heat sink.

As an example which meets the above requirements, a heat sink on which Ni and Pt layers are formed in sequence has been produced. However, with this structure, the location where metallic films are formed on the heat sink is limited to the one face to which the semiconductor light emitting element is bonded, which means that deterioration of a metal progresses from the edge, which finally results in deterioration of the semiconductor light emitting element. Then, if it is intended to form Ni and Pt layers on all the faces, although the film formation itself can be simply made by plating, for Pt plating, the cost of the plating solution is high, and the high speciality involves a low productivity. To form a metallic thin film on all the faces by vapor deposition and sputtering, it is necessary for the position of the same heat sink to be changed for repetitive film formation, which presents a problem that the productivity is poor and the cost is high.

The method has therefor been adopted which forms only the Ni layer on all the faces by plating, and thereafter, partially forms a Pt layer by vapor deposition and the sputtering film formation method. However, even this method has presented a problem that, because an Ni film and a Pt film cannot be consecutively formed, an Ni oxidized film layer is formed on the surface of the Ni plated layer during the interruption of the film formation, which permits heat to be easily generated at the interface between the Ni and Pt, and deteriorates the adhesion, resulting in lowered reliability.

Further, the Pt thin film has a high membrane stress compared to that in the film of any other metal, therefore, when the film thickness is increased, distortion can be generated at the bonding interface due to the membrane stress, resulting in lowered bond strength, and the reliability of the device being lowered due to the distortion.

As stated above, to bond a semiconductor light emitting element to the package, it is essential to minimize the distortion and the thermal resistance of the bonding surface, improve not only the initial characteristics but also the long-term reliability, and optimize the metallic structure of the heat sink and the film formation process for meeting cost productivity requirements as well.

The semiconductor light emitting device according to the present invention is a semiconductor light emitting device with which a semiconductor light emitting element is bonded to the top of a heat sink, the light emitting face being brought near a side face of the heat sink, in which the heat sink is provided with an Ni thin film layer on all the faces, and on the face of the heat sink to which the semiconductor light emitting element is bonded, and on the Ni thin film layer on the side face, a barrier metallic layer and a wettability improving metallic layer are stacked in sequence.

Preferably, the above-mentioned barrier metallic layer is of Ni, Ti or an NiTi alloy.

Preferably, the wettability improving metallic layer is of Pd, Pt or a PdPt alloy.

Preferably, the heat sink comprises Cu or CuW.

Preferably, the Ni thin film layer is formed by electroless plating or electroplating using a sulfamic acid bath, and has a film thickness of 2 $\mu$m to 6 $\mu$m.

Preferably, the barrier metallic layer and the wettability improving metallic layer have a layer thickness of 50 nm to 150 nm, respectively.

Preferably, the metallic layer has an area larger than that of the bonding surface of the semiconductor light emitting element.

Preferably the heat sink on which the metallic layer is formed has a flatness of Rmax 6 $\mu$m or less. In the specification, the term Rmax is determined according to its well known meaning. Specifically, as set forth in JIS B0601, Rmax is determined—when a sampled portion has been interposed between two parallel straight lines with a mean line of which length corresponds to the reference length that has been sampled from the profile—as the value, expressed in micrometers, measuring the spacing of these two straight lines in the direction of The method for manufacturing a semiconductor light emitting device according to the present invention sequentially stacks a barrier metallic layer and a wettability improving metallic layer on two adjacent faces of a heat sink which are provided with an Ni thin film layer on all the faces, and thereafter, a semiconductor light emitting element is bonded to one of the two faces, the other face and the light emitting face of the semiconductor light emitting element being brought near each other, in which the barrier metallic layer and the wettability improving metallic layer are consecutively formed in the same vacuum atmosphere.

Preferably, the above-mentioned barrier metallic layer and the wettability improving metallic layer are formed by vapor deposition or sputtering.

With the semiconductor light emitting device according to the present invention, a heat sink with which an Ni thin film layer is formed on all the faces is used, which means that, the Cu member of the heat sink is prevented from being corroded, the diffusion of the impurities from the heat sink to the semiconductor light emitting element can be suppressed, and the reliability can be improved. In addition, by adopting the plating method for formation of the Ni thin film layer, a film which allows flatness to be easily obtained can be produced at a low cost.

By forming an Ni barrier having a thickness of 50 nm to 150 nm again on the heat sink on which an Ni thin film is formed, if the impurities occurring on the layer surface after the Ni thin film layer was formed by plating should diffuse into the Ni barrier layer, the Ni barrier layer functions as a buffer layer, which means that the diffusion to the wettability improving metallic layer and the semiconductor light emitting element can also be suppressed, and the deterioration of the semiconductor light emitting element can be prevented, resulting in the reliability being improved.

By holding the film thickness of the Pt thin film in the range of 50 nm and 150 nm, the distortion of the bonding interface due to a membrane stress can be suppressed, which allows a uniform wettability to be obtained. Therefore, the reliability can be improved.

With the method for manufacturing semiconductor light emitting device according to the present invention, the Ni thin film layer and the Pt thin film layer are consecutively formed in the vacuum, therefore, foreign matter cannot easily be deposited on the Ni surface, these metallic layers can be produced using versatile processes, and the layers can be formed in a single setup, which allows the number of processes to be reduced, and the cost to be lowered.

SUMMARY OF THE INVENTION

The purpose of the present invention is to offer a low-cost semiconductor light emitting element having a high long-term reliability and a method for manufacture thereof.

BRIEF DESCRIPTION OF THE DRAWINGS

FIG. 1 is a perspective drawing of a semiconductor light emitting element package illustrating a first embodiment of the present invention.

DESCRIPTION OF THE PREFERRED EMBODIMENTS

Figure 2:
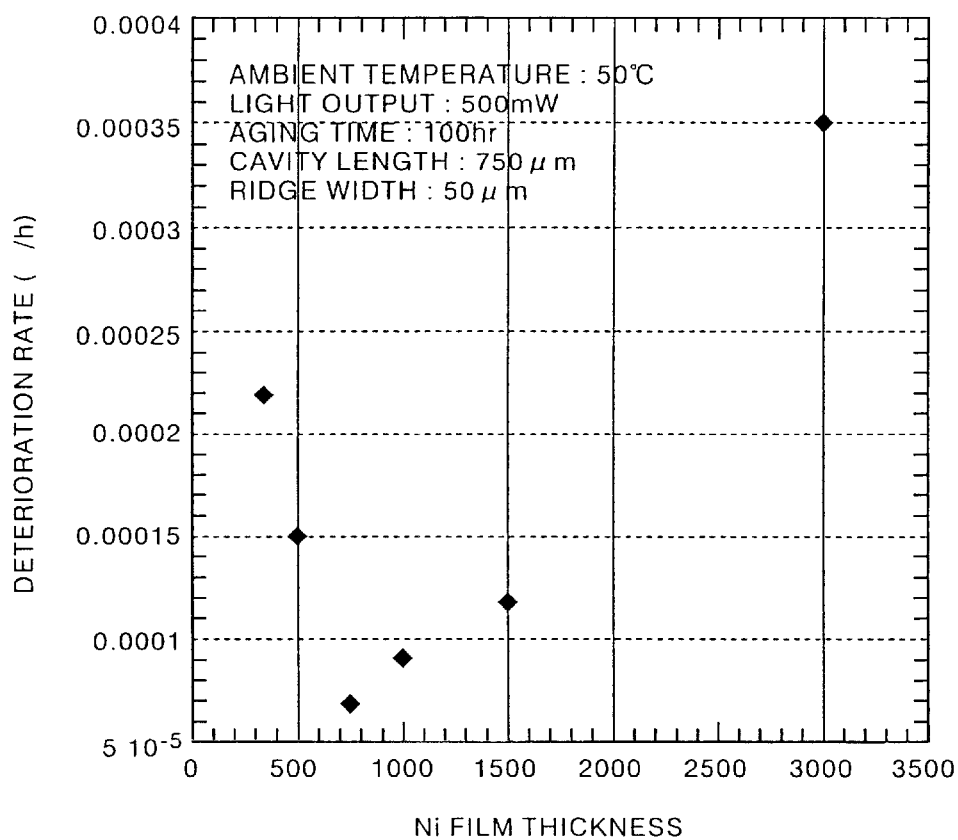
FIG. 2 is a graph illustrating the dependency of the deterioration rate on the Ni film thickness for the semiconductor light emitting element of the present invention.

Hereinbelow, embodiments of the present invention will be explained in detail with reference to the drawings.

FIG. 1 is a structural drawing of a semiconductor light emitting element package as an embodiment of the present invention.

As shown in FIG. 1, on all the faces of a heat sink 1, an Ni thin film layer is formed by using the plating method at a film thickness of 2 $\mu$m to 6 $\mu$m. Thereafter, on the face to which a semiconductor light emitting element 5 is to be bonded and the face on the side from which light is to be emitted, a barrier metallic layer 2 which will not directly react with copper is formed by vapor deposition and the sputtering film formation method at a film thickness of 50 nm to 150 nm in the region as wide as four times the area of the bonding bottom of the semiconductor light emitting element 5. Thereon, a wettability improving metallic layer 3 to improve the wetting with solder is formed consecutively in the same vacuum at a film thickness of 50 nm to 150 nm.

Here, the semiconductor light emitting element 5 is produced by stacking an AlGaAs layer, a GaAs layer, a GaAsP layer, and an InGaAs layer on a GaAs substrate, and thereafter, forming an N electrode comprising AuGe/Ni/Au and a P electrode comprising Au/Pt/Ti/Pt/Ti. This semiconductor light emitting element 5 is pressed against the bonding face of the heat sink 1 with a load of 10 g to 30 g, while an In solder 4 is melted at a temperature of approx. 200° C. to 250° C., which is followed by cooling and fixing.

Cu or CuW, which has a low thermal resistance, is used as the heat sink.

As the barrier metallic layer, it is preferable to use Ni or Ti, and as the wettability improving metallic layer, it is preferable to use Pd or Pt.

FIG. 2 shows a graph illustrating the dependency of the deterioration rate on the Ni film thickness for semiconductor light emitting elements of 50 $\mu$m in ridge width and 750 $\mu$m in cavity length when they are preaged for 100 hrs at a temperature of 50° C. and an output of 500 mW. From FIG. 2, it can be seen that, by holding the film thickness of the Ni thin film layer as the barrier metallic layer in the range of 50 nm to 150 nm, the deterioration rate can be kept low.

Figure 3:
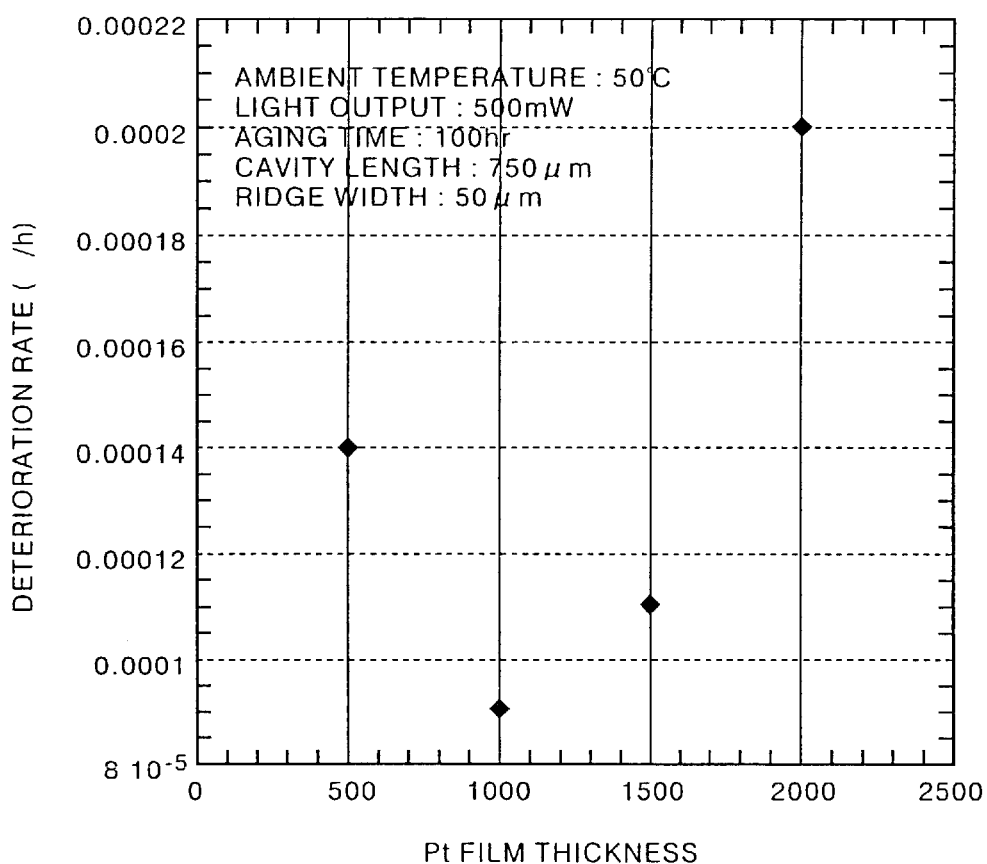
FIG. 3 is a graph illustrating the dependency of the deterioration rate on the Pt film thickness for the semiconductor light emitting element of the present invention.

FIG. 3 shows a graph illustrating the dependency of the deterioration rate on the Pt film thickness when preaging is made under the same conditions as those given in FIG. 2. From FIG. 3, it can be seen that, by holding the film thickness of the Pt thin film layer as the wettability improving metallic layer in the range of 50 nm to 150 nm, the deterioration rate can be kept low.

Therefore, with a semiconductor light emitting element package produced as stated above, an Ni thin film is formed by plating on all the faces of the heat sink, which means that the Cu member can be prevented from being corroded, the diffusion of the impurities from the heat sink to the semiconductor light emitting element can be suppressed, and a film which allows flatness to be obtained can be produced easily and at a low cost.

In addition, an Ni barrier is again formed on the heat sink on which an Ni thin film is formed, and thus, if the impurities, such as the residues when the Ni thin film layer was formed by plating, should diffuse into the Ni barrier layer, the Ni barrier layer functions as a buffer layer, which means that the diffusion to the wettability improving metallic layer and the semiconductor light emitting element can also be suppressed, and the deterioration of the semiconductor light emitting element can be prevented, resulting in the reliability being improved.

In addition, the Ni thin film layer and the Pt thin film layer are formed in the vacuum atmosphere, thus, thin film formation can be carried out in a single setup, which means that the number of processes can be reduced, and the cost can be lowered. In addition, consecutive formation of these two thin film layers allows prevention of deposition of foreign matter, such as moisture, and improvement in the reliability.

What is claimed is:

1. A semiconductor light emitting device, comprising:
   a heat sink having a plurality of faces and having an Ni thin film layer formed on all of said faces;
   a barrier metallic layer formed on said Ni thin film layer, said barrier metallic layer being formed on a portion of both a top face and an adjacent side face of said heat sink having an Ni thin film layer;

a wettability improving metallic layer formed on said barrier metallic layer; and a semiconductor light emitting element that is bonded to said wettability improving metallic layer, above said top face of said heat sink.

2. A semiconductor light emitting device according to claim 1, wherein said barrier metallic layer is of Ni, Ti or an NiTi alloy.

3. A semiconductor light emitting device according to claim 2, wherein said wettability improving metallic layer is of Pd, Pt or a PdPt alloy.

4. A semiconductor light emitting device according to claim 1, 2 or 3, wherein said heat sink comprises Cu or CuW.

5. A semiconductor light emitting device according to any one of claims 1 to 3, wherein said Ni thin film layer is formed by electroless plating or electroplating using a sulfamic acid bath, and has a film thickness of 2 $\mu$m to 6 $\mu$m.

6. A semiconductor light emitting device according to any one of claims 1 to 3, wherein said barrier metallic layer and said wettability improving metallic layer each have a layer thickness of 50 nm to 150 nm.

7. A semiconductor light emitting device according to any one of claims 1 to 3, wherein said wettability improving metallic layer has an area larger than that of a bonding surface of said semiconductor light emitting element.

8. A semiconductor light emitting device according to any one of claims 1 to 3, wherein said top face and said adjacent side face of said heat sink on which said metallic layers are formed each have a flatness of Rmax 6 $\mu$m or less.

9. A semiconductor light emitting device according to claim 3, wherein said semiconductor light emitting element is bonded to said wettability improving metallic layer by solder comprising In.

* * * * *